(12) United States Patent
Wang et al.

(10) Patent No.: US 10,992,508 B2
(45) Date of Patent: *Apr. 27, 2021

(54) NR BROADCAST CHANNEL TRANSMISSION

(71) Applicant: Telefonaktiebolaget LM Ericsson (publ), Stockholm (SE)

(72) Inventors: Jianfeng Wang, Beijng (CN); Asbjörn Grövlen, Stockholm (SE); Henrik Sahlin, Mölnlycke (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 3 days.

This patent is subject to a terminal disclaimer.

(21) Appl. No.: 16/574,560

(22) Filed: Sep. 18, 2019

(65) Prior Publication Data

US 2020/0014571 A1    Jan. 9, 2020

Related U.S. Application Data

(63) Continuation of application No. 16/204,265, filed on Nov. 29, 2018, now Pat. No. 10,476,722, which is a
(Continued)

(30) Foreign Application Priority Data

Mar. 24, 2017    (WO) ............... PCT/CN2017/078102

(51) Int. Cl.
*H04L 27/26*    (2006.01)
*H04L 25/03*    (2006.01)
(Continued)

(52) U.S. Cl.
CPC ...... *H04L 27/2655* (2013.01); *H03M 13/091* (2013.01); *H03M 13/41* (2013.01);
(Continued)

(58) Field of Classification Search
CPC .................................................. H04L 27/2655
(Continued)

(56) References Cited

U.S. PATENT DOCUMENTS 7,289,574 B2    10/2007    Parolari
7,308,104 B1    12/2007    Kim et al.
(Continued)

FOREIGN PATENT DOCUMENTS

CN    101931485 A    12/2010
RU    2292644 C2    1/2007
WO    2010147419 A2    12/2010

OTHER PUBLICATIONS

Unknown, Author, "Final Report of 3GPP TSG RAN WG1 #AH1_NR v1.0.0", 3GPP TSG RAN WG1 Meeting #88, R1-1701553, Athens, Greece, (Spokane, USA, Jan. 16-20, 2017), Feb. 13-17, 2017, 1-106.

(Continued)

*Primary Examiner* — Fritz Alphonse
(74) *Attorney, Agent, or Firm* — Murphy, Bilak & Homiller, PLLC

(57) ABSTRACT

The disclosure relates to a method performed by a wireless device, for receiving system information from a network node of a wireless communication system. The system information is received in a synchronization signal (SS) block of an SS burst set comprising at least one SS block. The system information is multiplexed with information providing a time index indicating which SS block of the SS burst set that is being received. The method comprises receiving the information providing the time index, and receiving the system information, which comprises descrambling the system information using a scrambling sequence generated based on the information providing the time index. The method also comprises determining an accuracy of the information providing the time index, based
(Continued)

on an error-detection code related to the received system information. The disclosure also relates to corresponding network node method and apparatus.

24 Claims, 7 Drawing Sheets

Related U.S. Application Data continuation of application No. PCT/SE2018/050287, filed on Mar. 21, 2018.

(51) Int. Cl.
*H04W 48/12* (2009.01)
*H03M 13/09* (2006.01)
*H03M 13/41* (2006.01)
*H04L 5/00* (2006.01)
*H04W 56/00* (2009.01)

(52) U.S. Cl.
CPC ...... *H04L 5/0035* (2013.01); *H04L 25/03872* (2013.01); *H04W 48/12* (2013.01); *H04W 56/0015* (2013.01)

(58) Field of Classification Search
USPC ................................ 714/758, 757, 760, 762
See application file for complete search history.

(56) References Cited

U.S. PATENT DOCUMENTS

| | | |
|---|---|---|
| 10,194,410 B2 | 1/2019 | Ly et al. |
| 10,476,722 B2 | 11/2019 | Wang et al. |
| 10,568,102 B2 | 2/2020 | Luo |
| 2004/0081260 A1 | 4/2004 | Matsusaka |
| 2013/0301618 A1 | 11/2013 | Tamaki et al. |
| 2016/0112221 A1 | 4/2016 | Zhang |
| 2016/0172057 A1 | 6/2016 | Her et al. |
| 2017/0150461 A1* | 5/2017 | Li ........................ H04L 27/2673 |
| 2018/0234931 A1* | 8/2018 | Ly ........................ H04L 5/0053 |
| 2018/0324623 A1 | 11/2018 | Jung et al. |
| 2019/0014493 A1* | 1/2019 | Kim ........................ H04W 76/27 |
| 2020/0221508 A1* | 7/2020 | Huang ................... H04W 68/02 |
| 2020/0275244 A1* | 8/2020 | Lee ...................... H04L 27/2607 |

OTHER PUBLICATIONS

3GPP, "3rd Generation Partnership Project; Technical Specification Group Radio Access Network; Evolved Universal Terrestrial Radio Access (E-UTRA); Physical channels and modulation (Release 14)", 3GPP TS 36.211 V14.2.0, Mar. 2017, pp. 1-194.

3GPP, "3rd Generation Partnership Project; Technical Specification Group Radio Access Network; Study on New Radio (NR) Access Technology; Physical Layer Aspects (Release 14)", 3GPP TR 38.802 V1.2.0, Feb. 2017, pp. 1-83.

Unknown, Author, "Design of SS burst set and SS block index", ZTE, ZTE Microelectronics, 3GPP TSG RAN NG1 Meeting #88, R1-1701573, Athens, Greece, Feb. 13-17, 2017, pp. 1-5.

Unknown, Author, "Discussion on SS burst set composition and SS block time index indication", Huawei, HiSilicon, 3GPP TSG RAN WG I Meeting #88, R1-1703353, Athens, Greece, Feb. 13-17, 2017, pp. 1-7.

Unknown, Author, "Discussion on synchronization procedure in NR", Sequans Communications, 3GPP TSG-RAN WG1 #88, R1-1701850, Athens, Greece, Feb. 13-17, 2017, pp. 1-6.

Dahlman, Erik, et al., "4G LTE/LTE-Advanced for Mobile Broadband", Relevant pp. 301-302, 304-306, 308, 2011, 1-447.

Dahlman, Erik, et al., "5G NR: The Next Generation Wireless Access Technology", Relevant pp. xv, 87, and 311-321, 2018, 1-470.

Unknown, Author, "Tertiary Synchronization Signal Design Considerations", U.S. Appl. No. 32/459,973, Feb. 16, 2017, 1-55.

Unknown, Author, "Tertiary Synchronization Signal Design Considerations", U.S. Appl. No. 32/462,258, Feb. 22, 2017, 1-57.

Unknown, Author, "Usage of Synchronization Signal Block Index in New Radio", U.S. Appl. No. 32/246,872, Feb. 23, 2017, 1-53.

* cited by examiner

NR BROADCAST CHANNEL TRANSMISSION

TECHNICAL FIELD

The invention relates to methods for transmitting system information in a synchronization signal block, as well as to a wireless device, a network node, computer programs, and computer program devices.

BACKGROUND

The fifth generation (5G) of mobile telecommunications and wireless technology is not yet fully defined but in an advanced draft stage within 3$^{rd}$ Generation Partnership Project (3GPP). It includes work on 5G New Radio (NR) Access Technology. Long term evolution (LTE) terminology is used in this disclosure in a forward-looking sense, to include equivalent 5G entities or functionalities although a different term is specified in 5G. A general description of the agreements on the physical layer aspects of 5G NR Access Technology so far is contained in 3GPP Technical Report 38.802 v1.2.0 (2017-02). Final specifications may be published inter alia in the future 3GPP TS 38.2** series.

FIG. 1 schematically illustrates a wireless communication network, where a User Equipment UE1 is wirelessly connectable to a Base Station BS 2. The BS 2 is connected to a core network CN 3. In an NR access network, the BS may be referred to as a gNB, and the corresponding terminology for an LTE access network is an eNB. The BS 2 serves the UE 1 located within the BS's geographical area of service, called a cell.

Initial Access and Synchronization in Cellular Systems

When a wireless device (or UE) first accesses a wireless communication system, it must synchronize to the system. The synchronization is required for the UE to know when the network will transmit various signals such as broadcast of system information (SI). The UE must also synchronize to the system to understand when it should transmit uplink signals, such as the random access signals transmitted during initial access.

A wireless communication system uses different time units to keep track of time. In systems using orthogonal frequency division multiplexing (OFDM), the term OFDM symbol is used for the smallest time unit. A number of symbols may form slots, a number of slots may form subframes, and a number of subframes may form radio frames. System information and paging information are typically distributed on a time scale where a radio frame is a relevant time unit. In many cellular system standards, a radio frame is 10 milliseconds in length.

In LTE, there are two synchronization signals: Primary synchronization signal (PSS) and Secondary synchronization signal (SSS). To perform initial access, the UE must obtain at least symbol and frame synchronization. To obtain symbol synchronization, the UE searches for a special synchronization sequence, which corresponds to the PSS. The PSS is typically one symbol long. By finding that sequence, the UE can establish symbol timing. The UE may also use the received PSS to determine frame synchronization. For that to be possible, every PSS must be transmitted with a fixed timing relation to the frame start. When the UE has found the PSS, it can also read an identifier of the current cell, and very basic system information, called the master information block (MIB). The PSS and SSS are thus used to indicate the physical-layer cell identity (PCI) to a UE, besides the functionality to provide the synchronization.

In NR, the concepts of PSS and SSS are re-used to provide the initial synchronization and are referred to as NR-PSS and NR-SSS. NR-PSS is defined for initial symbol boundary synchronization to the NR cell. NR-SSS is defined for detection of NR cell identity (cell ID) or at least part of NR cell ID.

In NR, a broadcast channel referred to as NR Physical Broadcast Channel (NR-PBCH) is defined. NR-PBCH is a non-scheduled broadcast channel carrying a part of minimum system information with fixed payload size and a periodicity predefined in the specification depending on carrier frequency range. NR-PBCH contents shall include at least part of the system frame number (SFN), and a Cyclic Redundancy Check (CRC). The following is a list of options to what the NR-PBCH may carry in terms of system information:

Option 1: NR-PBCH carries a part of essential system information for initial access including information necessary for UE to receive a channel carrying remaining essential system information;

Option 2: NR-PBCH carries minimum information necessary for UE to perform initial UL transmission in addition to the information in Option 1 allowing for initial access; and Option 3: NR-PBCH carries all essential system information for initial access.

In NR, it will be possible to transmit the NR-PSS using beamforming. The NR-PSS will be transmitted in different beams at different time instants. The beams over which the NR-PSS is transmitted are chosen so that a UE at any position in the cell can receive at least one NR-PSS transmission. Sometimes, the term beam sweep is used for this procedure. To support beam sweeping of the NR-PSS, more than one NR-PSS must be transmitted in each frame, otherwise, the synchronization delay will be too long. This means that NR-PSSs transmitted in different beams will have different offsets relative to the frame start, which in turn means that the UE cannot derive the frame start only from the time when it receives the NR-PSS. Some additional information is required.

To support beam sweeping with massive Multiple Input Multiple Output (MIMO), a new concept of SS block has been defined to include some basic signals and broadcast system information. NR-PSS, NR-SSS and/or NR-PBCH can be transmitted within an SS block. However, multiplexing other signals within an SS block is not precluded. A UE shall be able to identify an OFDM symbol index, a slot index in a radio frame, and a radio frame number from an SS block.

In the 3GPP agreements for NR, a basic structure for the synchronization signals and channels has been defined. FIG. 2b shows a schematic diagram of the basic structure for the synchronization signals transmission. One or multiple SS block(s) compose an SS burst. One or multiple SS burst(s) further compose an SS burst set, where the number of SS bursts within a SS burst set is finite. The number of SS block(s) composing one SS burst set is L in the example illustrated in FIG. 2b, where L is a positive integer. From physical layer specification perspective, at least one periodicity of the SS burst set is supported. From a UE perspective, an SS burst set transmission is periodic, and a UE may assume that a given SS block is repeated with a SS burst set periodicity.

3GPP has decided that there may be up to 64 SS blocks in an SS burst set. The minimum periodicity for SS block sets is 5 ms, and a radio frame is 10 ms. Thus, the number of SS blocks in a radio frame may be up to 128.

SUMMARY

The synchronization signals, including NR-PSS and NR-SSS, would thus be comprised in an SS block, and the terminal or UE is expected to acquire downlink synchronization via successful detection of the SS block. As indicated above, it is also considered that a part of system information is delivered in the NR-PBCH, which is also comprised in the SS block.

It has been agreed to multiplex the NR-PSS, NR-SSS and NR-PBCH in the time domain, i.e., time division multiplexing (TDM) of NR-PSS, NR-SSS and NR-PBCH, in an SS block.

To indicate the boundary of an SS burst and/or an SS burst set through the SS block detection, a time index should be provided from the SS block detection. In another way of phrasing it, the time index would indicate which SS block of an SS burst or SS burst set that has been detected, and/or which SS burst of an SS burst set that has been detected. Different ways of providing the time index has been under discussion in several 3GPP contributions. An extra so-called synchronization signal in the SS block, referred to as NR tertiary synchronization signal (NR-TSS), is one solution that has been discussed. The NR-TSS would provide the time index of an SS block in an SS burst or SS burst set. FIG. 2a schematically illustrates one example embodiment of an SS block comprising the system information of the NR-PBCH, the NR-TSS payload or bits, and the NR-PSS and NR-SSS, multiplexed in an SS block of a certain SS block bandwidth in the frequency dimension and an SS block size of four OFDM symbols in the time dimension. The time index provided by the NR-TSS can thus be used by the UE to determine where the boundary of the SS burst or the SS burst set is, or where the SS burst or SS burst set starts. In one example scenario, there may be up to 128 SS blocks in an SS burst or SS burst set. In order to provide a time index indicating the boundary of the SS burst or SS burst set in this example scenario, the NR-TSS must comprise at least seven bits.

Since the number of bits of the NR-TSS may not be very large, e.g., less than ten bits, a CRC attachment on the codeword of the NR-TSS would introduce a quite large overhead. It has therefore been considered to deliver NR-TSS without a CRC attached. However, this will incur the following problems:

The UE doesn't know whether the detection of the NR-TSS is correct or not;

If the NR-TSS is wrongly detected, the system information delivered in the NR-PBCH of the SS block, which is e.g. needed to be able to perform a random access, cannot be decoded correctly, as the time index indicating the boundary of the SS burst or SS burst set is incorrect;

This would in turn result in a delay for receiving the system information and performing the random access or initial access procedure.

It is therefore an object to address some of the problems outlined above, and to provide a solution making it possible for the terminal or UE to know as soon as possible whether the detected or received value of the time index, e.g. derived from NR-TSS, is correct or not, in order to avoid unnecessary overhead and delay with regards to the initial access procedure.

According to a first aspect, a method performed by a wireless device, for receiving system information from a network node of a wireless communication system is provided. The system information is received in a synchronization signal, SS, block of an SS burst set comprising at least one SS block. The system information is multiplexed with information providing a time index indicating which SS block of the SS burst set that is being received. The method comprises receiving the information providing the time index. The method further comprises receiving the system information, wherein receiving comprises descrambling the system information using a scrambling sequence generated based on the information providing the time index. The method also comprises determining an accuracy of the information providing the time index, based on an error-detection code related to the received system information.

According to a second aspect, a method performed by a network node of a wireless communication network, for transmitting system information to a wireless device in a synchronization signal, SS, block of an SS burst set comprising at least one SS block is provided. The system information is multiplexed with information providing a time index indicating which SS block of the SS burst set that is being transmitted. The method comprises scrambling the system information using a scrambling sequence generated based on the information providing the time index, and transmitting to the wireless device, the scrambled system information multiplexed with the information providing the time index of the SS block, wherein an error detection code is related to the system information.

According to other aspects, a wireless device, a network node, a computer program and a computer program product according to the appended claims are provided.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

Other objects, advantages and features of embodiments will be explained in the following detailed description when considered in conjunction with the accompanying drawings and claims.

BRIEF DESCRIPTION OF THE DRAWINGS

The invention is now described, by way of example, with reference to the accompanying drawings, on which.

DETAILED DESCRIPTION

Figure 1:
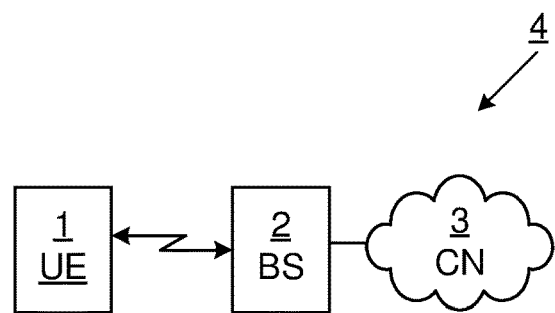
FIG. 1 is a schematic diagram illustrating an environment where embodiments presented herein can be applied.

In the following, different aspects will be described in more detail with references to certain embodiments and to accompanying drawings. For purposes of explanation and not limitation, details are set forth, such as particular scenarios and techniques, in order to provide a thorough understanding of the different embodiments. However, other embodiments that depart from these details may also exist.

Furthermore, in some instances detailed descriptions of well-known methods, nodes, interfaces, circuits, and devices are omitted so as not obscure the description with unnecessary detail. Those skilled in the art will appreciate that the functions described may be implemented in one or in several nodes. Some or all of the functions described may be implemented using hardware circuitry, such as analog and/or discrete logic gates interconnected to perform a specialized function, or ASICs. Likewise, some or all of the functions may be implemented using software programs and data in conjunction with one or more digital microprocessors or general purpose computers. Where nodes that communicate using the air interface are described, it will be appreciated that those nodes also have suitable radio communications circuitry. Moreover, the technology may be embodied entirely within any form of computer-readable memory, including non-transitory embodiments such as solid-state memory, magnetic disk, or optical disk containing an appropriate set of computer instructions or computer program code that would cause a processor to carry out the techniques described herein.

Hardware implementations of the present invention may include or encompass, without limitation, digital signal processor (DSP) hardware, a reduced instruction set processor, hardware (e.g., digital or analog) circuitry including but not limited to application specific integrated circuit(s) (ASIC) and/or field programmable gate array(s) (FPGA(s)), and where appropriate state machines capable of performing such functions.

In terms of computer implementation, a computer is generally understood to comprise one or more processors or one or more controllers, and the terms computer, processor, and controller may be employed interchangeably. When provided by a computer, processor, or controller, the functions may be provided by a single dedicated computer or processor or controller, by a single shared computer or processor or controller, or by a plurality of individual computers or processors or controllers, some of which may be shared or distributed. Moreover, the term "processor" or "controller" also refers to other hardware capable of performing such functions and/or executing software, such as the example hardware recited above.

Herein the terms user equipment (UE), terminal, and wireless device are used interchangeably to denote a device that communicates with a network infrastructure, a wireless communication network, or a radio access network. The term should not be construed as to mean any specific type of device, i.e. it applies to them all, and the embodiments described herein are applicable to all devices that use the concerned solution to solve the problems as described. Wireless devices are referred to as UE in 3GPP terminology, and may comprise, for example, cellular telephones, personal digital assistants, smart phones, laptop computers, handheld computers, machine-type communication/machine-to-machine (MTC/M2M) devices or other devices or terminals with wireless communication capabilities. Wireless devices may refer to terminals that are installed in fixed configurations, such as in certain machine-to-machine applications, as well as to portable devices, or devices installed in motor vehicles.

Similarly, a network node is intended to denote the node in the network infrastructure that communicates with the UE, sometimes also referred to as a base station (BS). Different names may be applicable depending on the radio access technology, such as eNB, and gNB. The functionality of the network node may be distributed in various ways. For example, there could be a radio head terminating parts of the radio protocols and a centralized unit that terminates other parts of the radio protocols. The term network node will refer to all alternative architectures that can implement the concerned invention, and no distinction between such implementations will be made.

Embodiments are described in a non-limiting general context in relation to an example scenario in an NR wireless communication network or system, such as the network illustrated in FIG. 1, in which a gNB (BS 2) sends system information to the UE 1 in an SS block of an SS burst set, where the SS block comprises an NR-TSS, i.e. information providing a time index of the SS block. The information providing the time index may not have any error-detection code such as a CRC attached to it. However, it should be noted that the information providing the time index of the SS block may in embodiments correspond to another type of signal than the NR-TSS, and that the embodiments may be applied to any wireless communication network implementing network synchronization through the transmission of multiple SS blocks in SS burst sets as described previously.

The problem of delays related to the process of receiving system information and performing initial access, introduced due to errors in the received NR-TSS of the SS block, is addressed by a solution allowing the accuracy or reliability of the received NR-TSS to be checked early in an initial access procedure, through a scheme comprising scrambling of the system information of the NR-PBCH with a scramble code or sequence generated by the time index indicated or provided by the NR-TSS.

In one embodiment, the scrambling is done on the coded bits of the system information, e.g. by elementwise multiplication of each bit with a pseudo-random sequence, where the pseudo-random sequence is generated based on the information providing the time index. The pseudo-random sequence may optionally also be generated based on the cell ID, alone or in combination with some other parameter or value received in the SS block.

In another embodiment, the scrambling is done on a modulation symbol level, e.g. by elementwise multiplication of each Quadrature phase-shift keying (QPSK) symbol of the system information of NR-PBCH with the pseudo-random sequence, where the pseudo-random sequence may be generated as described above.

Some advantages of embodiments of the invention is that the delay and the unnecessary transmissions that may occur due to an erroneous detection of NR-TSS and thus an incorrect time index value can be avoided.

Scrambling Sequence Generation

The sequence used to scramble signals may in one example embodiment be a pseudo-random sequence, which could be flexibly selected. Using the sequence defined in LTE as an example, defining a length-31 Gold sequence as the pseudo-random sequence, the output sequence $c(n)$ of length $M_{PN}$, where $n=0, 1, \ldots, M_{PN}-1$, is defined by $$c(n) = (x_1(n+N_c) + x_2(n+N_c)) \bmod 2$$

$$x_1(n+31) = (x_1(n+3) + x_1(n)) \bmod 2$$

$$x_2(n+31) = (x_2(n+3) + x_2(n+2) + x_2(n+1) + x_2(n)) \bmod 2$$

where $N_c = 1600$. The first m-sequence shall be initialized with $x_1(0) = 1$, $x_1(n) = 0$, $n = 1, 2, \ldots, 30$. The initialization of the second m-sequence is denoted by $c_{init} = \sum_{i=0}^{30} x_2(i) \cdot 2^i$ with the value depending on the application of the sequence.

For NR-PBCH transmissions, such as system information transmissions, the scrambling sequence could be initialized at the start of each SS block, SS burst, or SS burst set. The initialization value corresponding to $c_{init}$ depends on the time index derived from NR-TSS, and optionally also on cell ID and other values that may be needed for generating the sequence, such as the SFN. For example, the value can be defined according to the following:

$$c_{init} = x + n_{SSB} \cdot 2^9 + N_{ID}^{cell},$$

where $n_{SSB}$ is the SS block time index to be delivered or provided by NR-TSS, and $N_{ID}^{cell}$ is the cell ID, which is delivered by the NR-SSS and NR-PSS in the same SS block. The value of x may be regarded as other information that may be delivered in the NR-PBCH in embodiments of the invention, such as the SFN.

Scrambling the NR-PBCH Information With the Generated Sequence

Figure 2A:
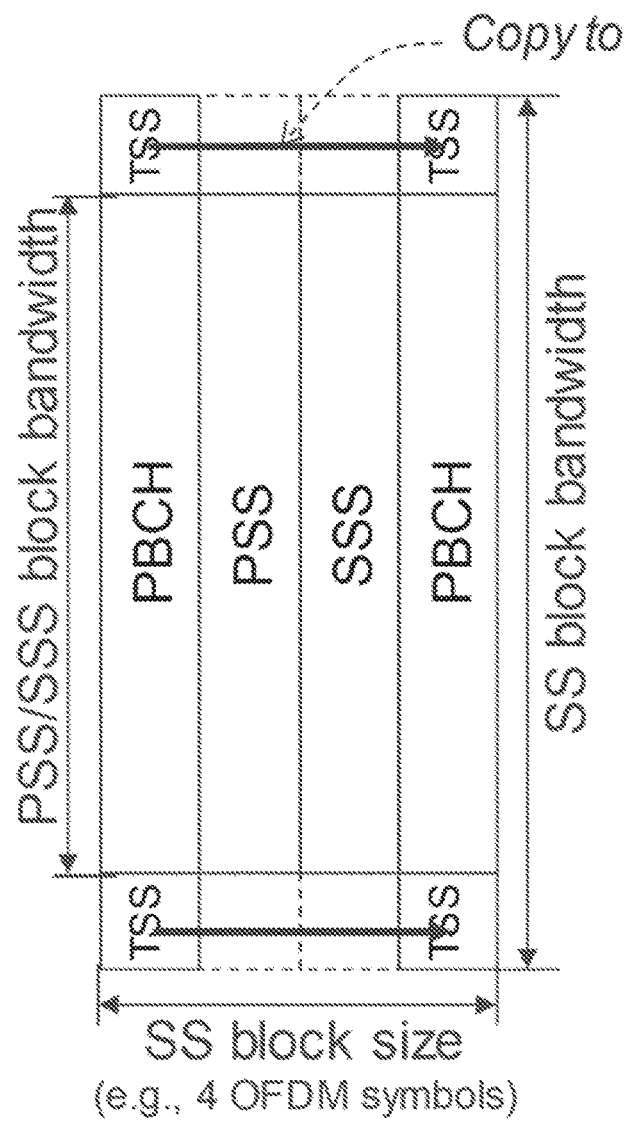
FIG. 2a is a schematic illustration of an example of an SS block comprising NR-TSS.
Figure 2B:
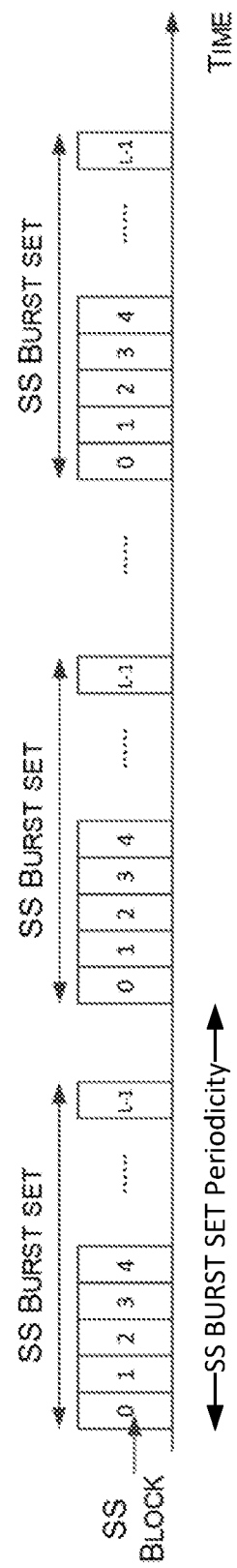
FIG. 2b is a schematic diagram illustrating SS blocks, and SS burst sets.
Figure 2C:
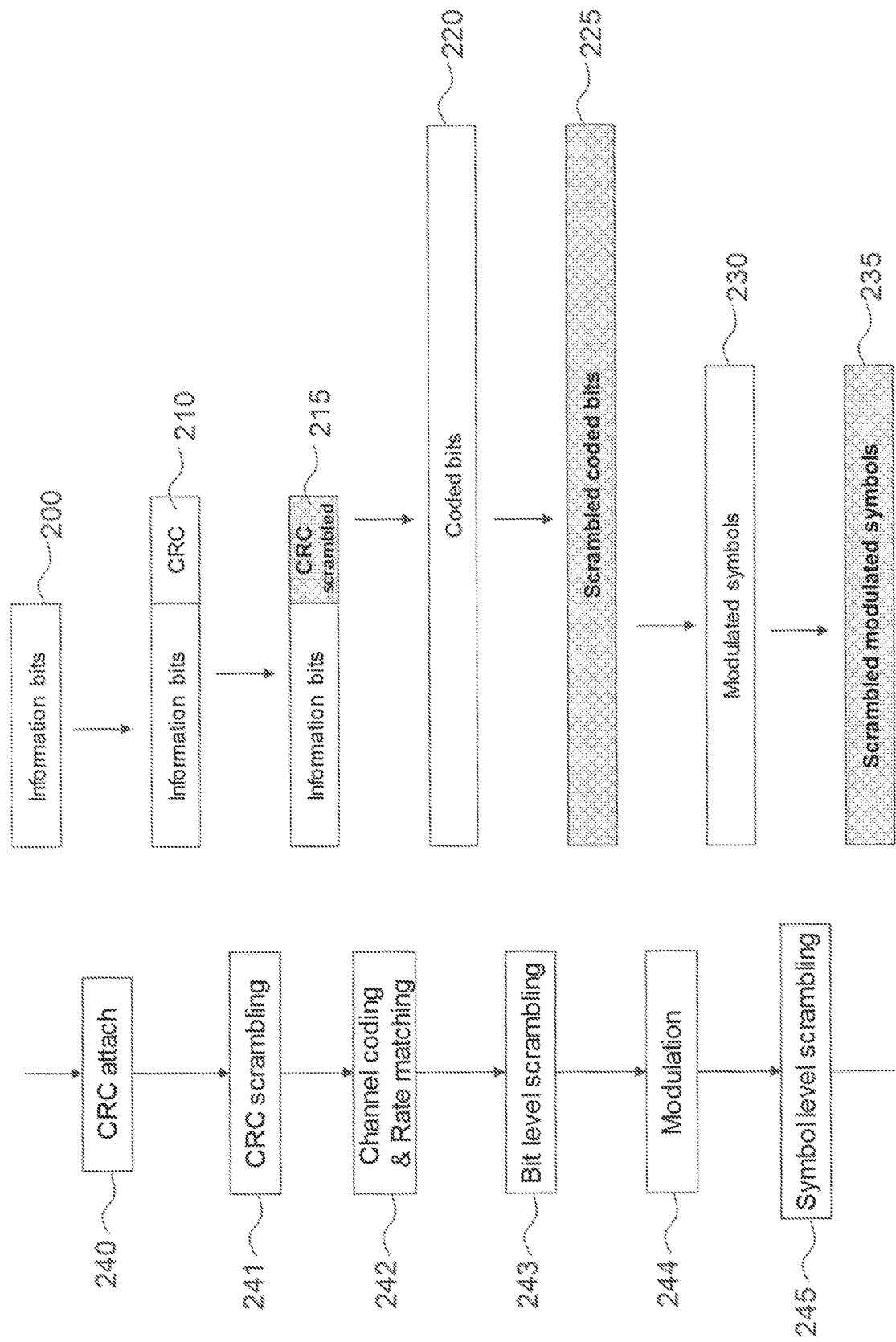
FIG. 2c is a flowchart of the NR-PBCH scrambling procedure and an illustration of the resulting scrambled bits and symbols.

Once the scrambling sequence has been generated, the scrambling procedure of the information carried by NR-PBCH can be started. The scrambling procedure of the information may be done on different levels as illustrated in FIG. 2c. The flowchart on the left-hand side of FIG. 2c shows the procedure step by step, and on the right-hand side the resulting bits or symbols are shown. The procedure starts with the information bits 200 corresponding to the system information of NR-PBCH. In 240 the CRC is attached, resulting in information bits with a CRC attachment 210. In a first embodiment, the CRC bits are the only ones scrambled, illustrated in step 241, with the resulting scrambled CRC bits shown in 215. The scrambling may be done on this level, i.e. only the CRC bits of a NR-PBCH transport block are scrambled. In such an embodiment, the receiving wireless device or UE, receives the NR-PBCH information with the scrambled CRC. The UE also generates a scrambling sequence based on the time index it has received in the SS block and can thus descramble the CRC bits using the scrambling sequence. After the descrambling, the UE may perform the CRC check on the system information of the NR-PBCH received according to the time index provided by the NR-TSS. If the CRC check indicates erroneously received system information, it may be due to either that the NR-TSS has been incorrectly detected or received and thus provides an incorrect time index value, or that the reception of the system information of the NR-PBCH itself is incorrect. In either case, the following procedure of initial access would be stopped, as soon as the CRC check indicates an error, thus avoiding unnecessary delay. A new SS block could then be detected which may provide correct system information. The correctly received system information would eventually make it possible to perform a complete initial access procedure.

In a second embodiment, channel coding and rate matching in 242 is performed on the information bits with attached CRC bits. The attached CRC bits may be scrambled 215 as described above, but they may also be unscrambled. This results in coded bits 220. Bit level scrambling in 243 may be performed on the coded bits 220, resulting in scrambled coded bits 225. In this embodiment, all coded bits would be scrambled using the scrambling sequence by the network node. If the scrambling sequence is wrongly generated by the wireless device due to erroneous values of the time index provided by the NR-TSS, the CRC check of the wireless device on the receiving side will indicate it. The wireless device may thus deduce that either the NR-TSS providing the time index is incorrect, or the system information is incorrect, in analogy with the previous example where only the CRC bits were scrambled.

Regardless of whether the coded bits have been scrambled or not, they may undergo modulation in 244, thus resulting in modulated symbols 230. In a third embodiment, the modulated symbols may undergo symbol level scrambling in 245, resulting in scrambled modulated symbols 235. In this embodiment, a CRC checking for the NR-PBCH system information performed by the receiving wireless device would indicate whether the received time index is accurate or not. As indicated above, the first, second, and third embodiments covering scrambling on different levels, can be combined in any way or implemented independently from each other. Common for them all is that the time index provided from NR-TSS is involved in each of the scrambling procedures as it is used to generate the scrambling sequence. The same or different scrambling sequences may be used for the scrambling on the different levels.

Embodiments of Methods Described With Reference to FIGS. 3-4 and FIG. 7

Figure 7:
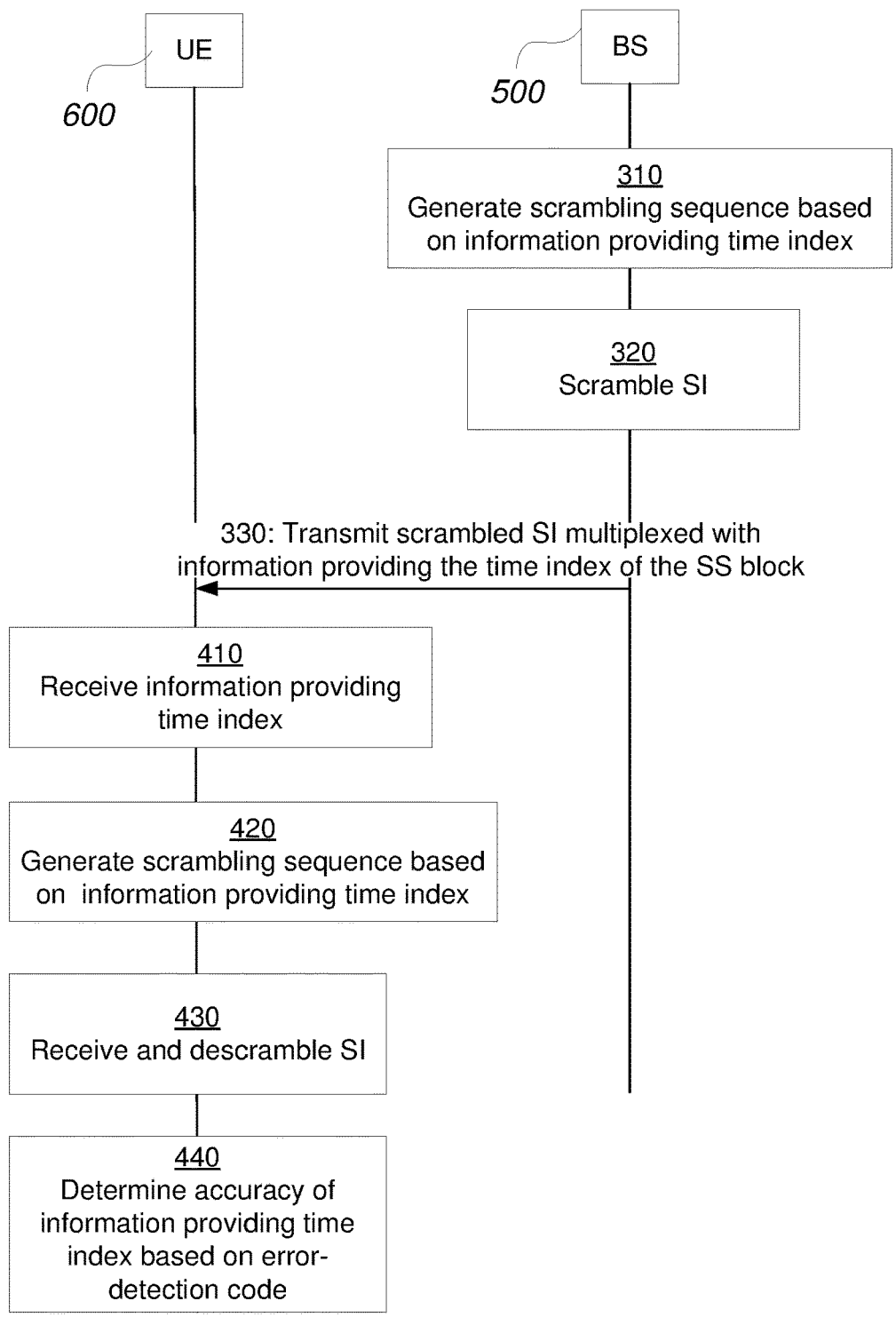
FIG. 7 is a signaling diagram schematically illustrating embodiments of the methods performed in a UE or wireless device and a BS or a network node.

FIG. 7 is a signaling diagram schematically illustrating embodiments of the methods performed in a UE or wireless device 600 and a BS or a network node 500, such as a UE and a gNB of an NR system. The BS 500 broadcasts SS blocks in SS burst sets in a cell. When beam sweeping is used, as explained in the background section, each SS block of the SS burst set is transmitted in a respective beam, at a respective time instance of the radio frame, as illustrated in FIG. 2b. A certain UE in the cell will thus receive at least one of the SS blocks, comprising NR-PSS, NR-SSS, and NR-PBCH carrying system information multiplexed with information providing the time index. The time index indicates which SS block of the SS burst set that is being received. This information is needed for the UE to be able to synchronize to the network. Based on the information providing the time index, the network node generates 310 a scrambling sequence and scrambles 320 the system information bits as described previously. The network node then transmits 330 the SS block comprising the scrambled system information multiplexed with the information providing the time index. The UE receives 410 the SS block comprising the information providing the time index and generates 420 a scrambling sequence based on the information providing the time index. The scrambling sequence is used to receive 430 and descramble the system information. Using the error-detection code attached to the system information, the UE can then determine 440 the accuracy of the information providing the time index. The UE may assume that the information providing the time index is inaccurate if the error-detection code indicates erroneously received system information.

Figure 3:
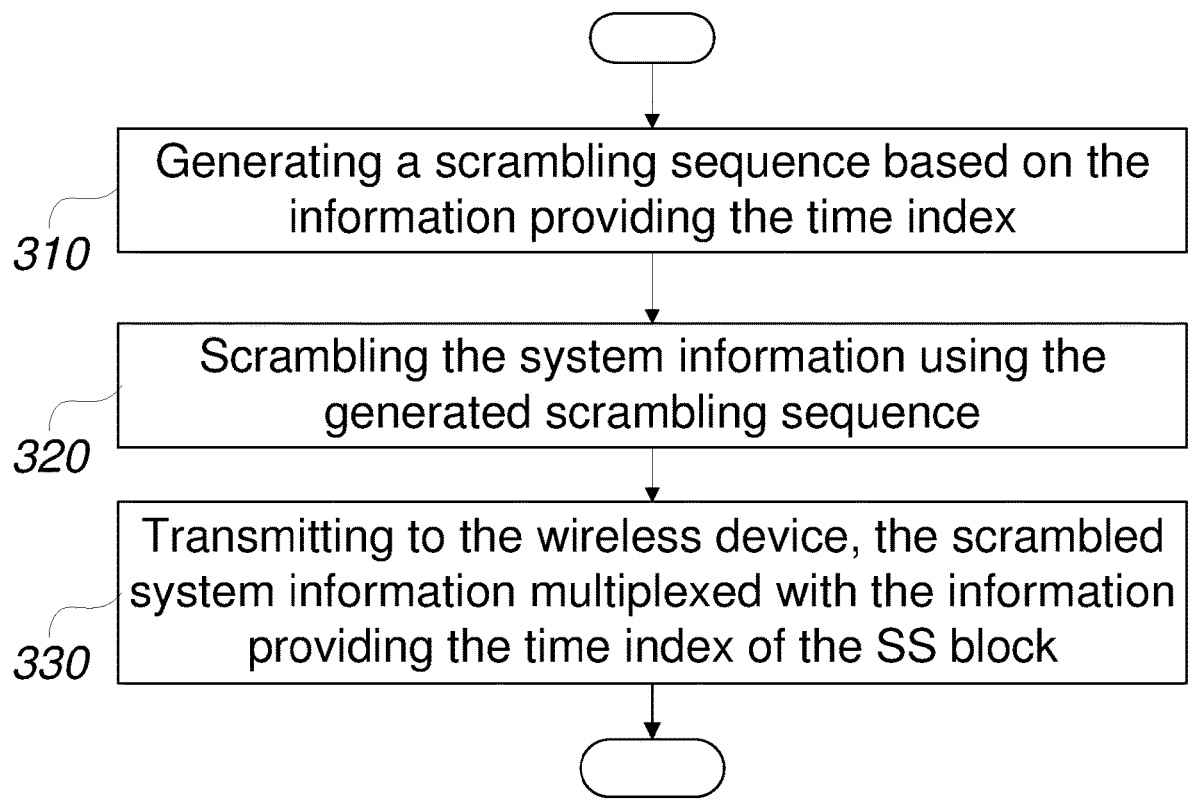
FIG. 3 is a flowchart illustrating the method in a network node according to embodiments.

FIG. 3 is a flowchart illustrating one embodiment of a method performed by a network node of a wireless communication network, for transmitting system information to a wireless device in a synchronization signal, SS, block of an SS burst set comprising at least one SS block. In one embodiment, the wireless device is a UE and the network node is a gNodeB. The system information is multiplexed with information providing a time index indicating which SS block of the SS burst set that is being transmitted. The information providing the time index may be transmitted without any related error-detection code. The method comprises:

320: Scrambling the system information using a scrambling sequence generated 310 based on the information providing the time index. In embodiments, scrambling the system information comprises scrambling coded bits of the system information, as described above. However, the scrambling can be performed on different levels. Scrambling the system information may thus comprise at least one of the following: scrambling error-detection code bits related to the system information; scrambling coded bits of the system information; and scrambling modulated symbols of the system information. Generating 310 the scrambling sequence may comprise initializing the scrambling sequence at the start of the SS block. Furthermore, the scrambling sequence may be a pseudo-random sequence generated based on an identity of a cell, cell ID, related to the SS block, i.e. the cell in which the SS block is broadcasted. In other example embodiments, the scrambling sequence may be a pseudo-random sequence for which an initialization value is dependent on the time index. The initialization value may be dependent on a further parameter provided by information carried by the SS block, such as a cell ID or an SFN.

330: Transmitting to the wireless device, the scrambled system information multiplexed with the information providing the time index of the SS block, wherein an error detection code is related to the system information. The error detection code may be a Cyclic Redundancy Check CRC attachment to information bits corresponding to the system information In embodiments, the SS block has a certain size in the time dimension during which synchronization signals (e.g. NR-PSS and NR-SSS), the information providing the time index (in one embodiment the NR-TSS in the SS block), and system information (in NR-PBCH) are transmitted.

Figure 4:
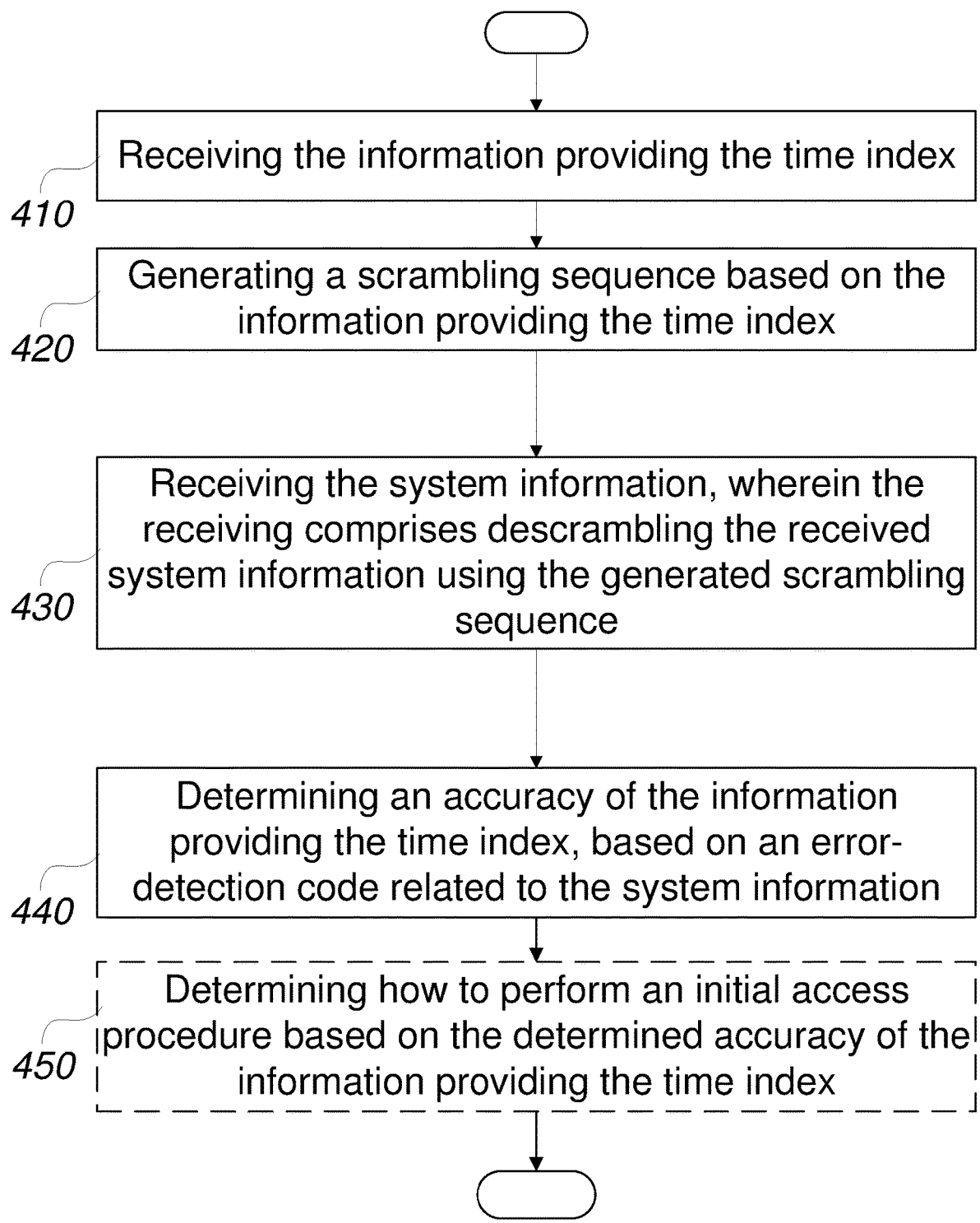
FIG. 4 is a flowchart illustrating the method in a wireless device according to embodiments.

FIG. 4 is a flowchart illustrating one embodiment of a method performed by a wireless device, for receiving system information from a network node of a wireless communication system, the system information being received in an SS block of an SS burst set comprising at least one SS block. In one embodiment, the wireless device is a UE and the network node is a gNodeB. The system information is multiplexed with information providing a time index indicating which SS block of the SS burst set that is being received. The information providing the time index may be received without any related error-detection code. The method comprises:

410: Receiving the information providing the time index.

430: Receiving the system information, wherein receiving comprises descrambling the system information using a scrambling sequence generated 420 based on the information providing the time index. Descrambling the system information may comprise descrambling coded bits of the system information. However, descrambling the received system information may comprise at least one of the following as described above: descrambling bits of the error-detection code related to the system information; descrambling coded bits of the system information; and descrambling modulated symbols of the system information. Generating 420 the scrambling sequence may comprise initializing the scrambling sequence at the start of the SS block. The scrambling sequence may be a pseudo-random sequence generated based on an identity of a cell, cell ID, related to the SS block. In embodiments, the scrambling sequence may be a pseudo-random sequence for which an initialization value is dependent on the time index. Furthermore, the initialization value may be dependent on a further parameter provided by information carried by the SS block.

440: Determining an accuracy of the information providing the time index, based on an error-detection code related to the received system information.

In embodiments, the error detection code may be a CRC attachment to information bits corresponding to the received system information. Determining 440 the accuracy of the information providing the time index may in these embodiments comprise:

performing a CRC of the received system information based on the CRC attachment, determining that the information providing the time index is inaccurate when the performed CRC indicates erroneously received system information, and determining that the information providing the time index is accurate when the performed CRC indicates correctly received system information.

The method may further comprise determining 450 how to perform an initial access procedure based on the determined accuracy of the information providing the time index. The determining 450 how to perform an initial access procedure may further comprise:

when the information providing the time index is determined to be accurate, completing the initial access procedure based on the received system information, when the information providing the time index is determined to be inaccurate, detecting another SS block for reception of system information and time index before completing the initial access procedure.

In embodiments, the method further comprises acquiring synchronization with the network node based on the information in the SS block.

The method may further comprise determining where the boundary of the SS burst set is or where the SS burst set starts using the information providing the time index.

In embodiments, the system information is received based on a boundary of the SS burst set indicated by the time index.

In embodiments, the SS block has a certain size in the time dimension during which synchronization signals (e.g. NR-PSS and NR-SSS), the information providing the time index (in one embodiment the NR-TSS in the SS block), and system information (in NR-PBCH) are transmitted.

Embodiments of Apparatus Described With Reference to FIGS. 5-6

Figure 5:
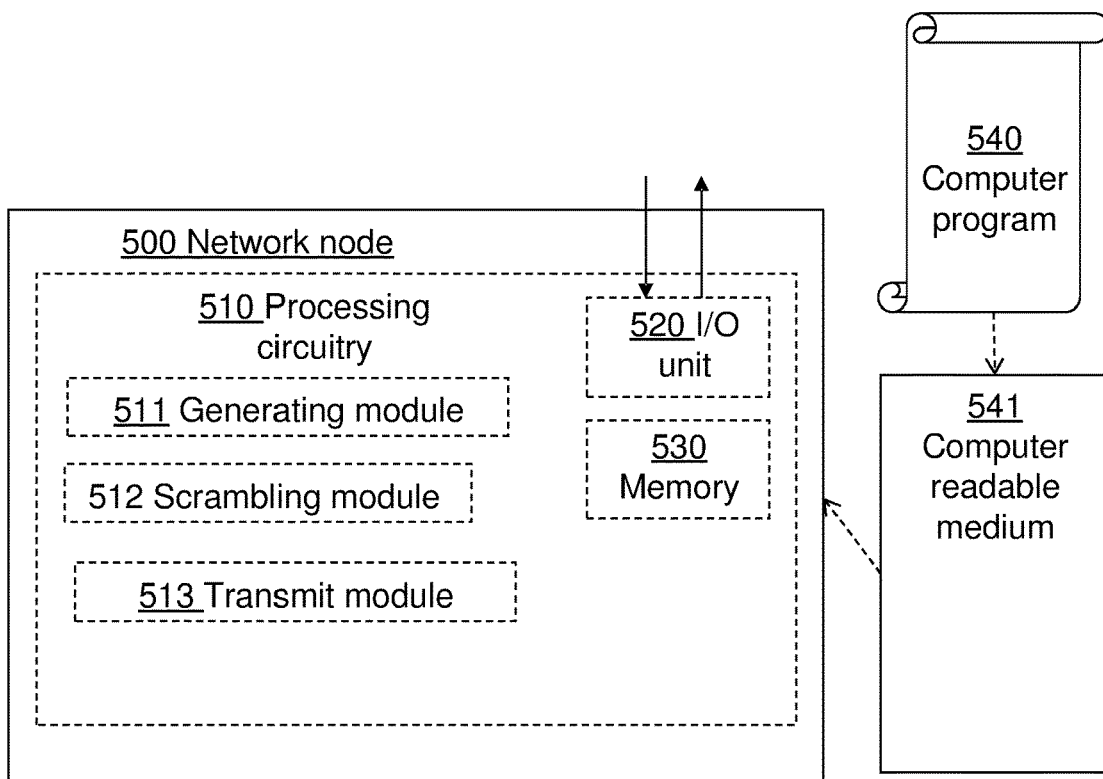
FIG. 5 is a block diagram schematically illustrating a network node according to embodiments.

An embodiment of the network node 500 of a wireless communication network, configured to transmit system information to a wireless device in a synchronization signal, SS, block of an SS burst set comprising at least one SS block is illustrated in the block diagram of FIG. 5. In embodiments, the network node is a gNodeB. The system information is multiplexed with information providing a time index indicating which SS block of the SS burst set that is being transmitted. The network node is further configured to scramble the system information using a scrambling sequence generated based on the information providing the time index, and transmit to the wireless device, the scrambled system information multiplexed with the information providing the time index of the SS block, wherein an error detection code is related to the system information.

In embodiments, the network node is further configured to scramble the system information by scrambling coded bits of the system information. The error detection code may be a Cyclic Redundancy Check CRC attachment to information bits corresponding to the system information.

The network node may be configured to transmit the information providing the time index without any related error-detection code. The network node may be further configured to generate the scrambling sequence by initializing the scrambling sequence at the start of the SS block. In embodiments, the scrambling sequence is a pseudo-random sequence, and the network node may be further configured to generate the pseudo-random sequence based on an identity of a cell, cell ID, related to the SS block.

As illustrated in FIG. 5, the network node 500 may comprise at least one processing circuitry 510 and optionally also a memory 530. In embodiments, the memory 530 may be placed in some other node or unit or at least separately from the network node. The network node may also comprise one or more input/output (I/O) units 520 configured to communicate with a wireless device or another network node. The input/output (I/O) unit 520 may in embodiments comprise a transceiver connected to one or more antennas over antenna ports for wireless communication with wireless devices in the network, and/or an interface circuitry adapted for communication with other network nodes over various interfaces. The memory 530 may contain instructions executable by said at least one processing circuitry 510, whereby the network node may be configured to perform the methods described herein e.g. with reference to FIG. 3.

In another embodiment also illustrated in FIG. 5, the network node may comprise a generating module 511, a scrambling module 512, and a transmit module 513, adapted to respectively perform the method steps illustrated in FIG. 3.

The network node may contain further modules adapted to perform any of the methods previously described herein.

The modules described above are functional units which may be implemented in hardware, software, firmware or any combination thereof. In one embodiment, the modules are implemented as a computer program running on the at least one processing circuitry 510.

In still another alternative way to describe the embodiment in FIG. 5, the network node may comprise a Central Processing Unit (CPU) which may be a single unit or a plurality of units. Furthermore, the network node may comprise at least one computer program product (CPP) with a computer readable medium 541, e.g. in the form of a non-volatile memory, e.g. an EEPROM (Electrically Erasable Programmable Read-Only Memory), a flash memory or a disk drive. The CPP may comprise a computer program 540 stored on the computer readable medium 541, which comprises code means which when run on the CPU of the network node causes the network node to perform the methods described earlier in conjunction with FIG. 3. In other words, when said code means are run on the CPU, they correspond to the at least one processing circuitry 510 of the network node in FIG. 5.

Figure 6:
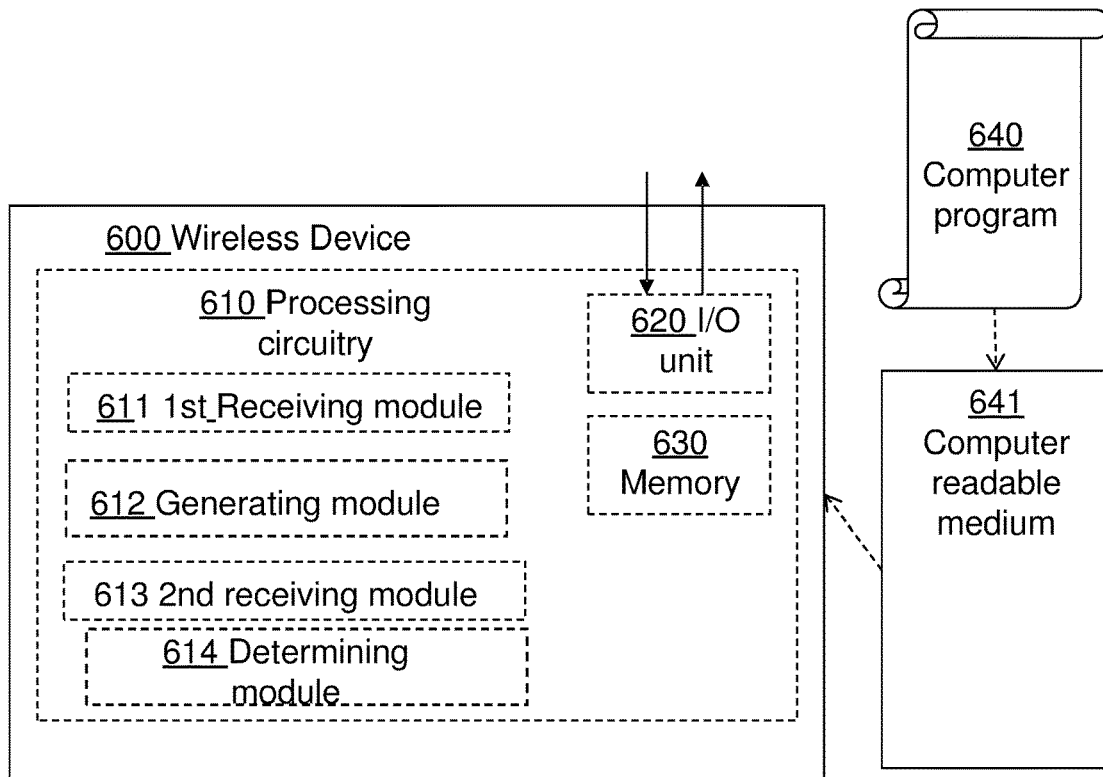
FIG. 6 is a block diagram schematically illustrating a wireless device according to embodiments.

An embodiment of the wireless device 600 is schematically illustrated in the block diagram in FIG. 6. The wireless device 600 is configured to receive system information from a network node of a wireless communication system, the system information being received in a synchronization signal, SS, block of an SS burst set comprising at least one SS block. In embodiments, the wireless device is a UE. The system information is multiplexed with information providing a time index indicating which SS block of the SS burst set that is being received. The wireless device is further configured to receive the information providing the time index, receive the system information by descrambling the system information using a scrambling sequence generated based on the information providing the time index, and determine an accuracy of the information providing the time index, based on an error-detection code related to the received system information.

In embodiments, the error detection code is a Cyclic Redundancy Check CRC attachment to information bits corresponding to the received system information, and the wireless device is further configured to determine the accuracy of the information providing the time index by:
performing a CRC of the received system information based on the CRC attachment,
determining that the information providing the time index is inaccurate when the performed CRC indicates erroneously received system information, and
determining that the information providing the time index is accurate when the performed CRC indicates correctly received system information.

The wireless device may be further configured to determine how to perform an initial access procedure based on the determined accuracy of the information providing the time index.

In embodiments, the wireless device is further configured to determine how to perform the initial access procedure by:
when the information providing the time index is determined to be accurate, completing the initial access procedure based on the received system information, and
when the information providing the time index is determined to be inaccurate, detecting another SS block for reception of system information and time index before completing the initial access procedure.

In embodiments, the wireless device is further configured to acquire synchronization with the network node based on the information in the SS block.

The wireless device may be further configured to descramble the system information by descrambling coded bits of the system information.

The wireless device may be further configured to receive the information providing the time index without any related error-detection code.

In embodiments, the wireless device is further configured to generate the scrambling sequence by initializing the scrambling sequence at the start of the SS block.

The wireless device may be further configured to determine where the boundary of the SS burst set is or where the SS burst set starts using the information providing the time index.

The wireless device may be further configured to receive the system information based on a boundary of the SS burst set indicated by the time index.

In embodiments, the scrambling sequence is a pseudo-random sequence and the wireless device is configured to generate the pseudo-random sequence based on an identity of a cell, cell ID, related to the SS block.

As illustrated in FIG. 6, the wireless device 600 may comprise at least one processing circuitry 610 and optionally also a memory 630. In embodiments, the memory 630 may be placed in some other node or unit or at least separately from the wireless device 600. The wireless device 600 may also comprise one or more input/output (I/O) units 620 configured to communicate with a network node such as an gNodeB. The input/output (I/O) unit 620 may in embodiments comprise a transceiver connected to one or more antennas over antenna ports for wireless communication with network nodes in the network. The memory 630 may contain instructions executable by said at least one processing circuitry 610, whereby the wireless device 600 may be configured to perform any of the methods previously described herein, e.g. with reference to FIG. 4.

In another embodiment also illustrated in FIG. 6, the wireless device 600 may comprise a first receiving module 611, a generating module 612, a second receiving module 613, and a determining module 614 adapted to respectively perform the method steps of FIG. 4.

The wireless device 600 may contain further modules adapted to perform any of the methods previously described herein. The modules described above are functional units which may be implemented in hardware, software, firmware or any combination thereof. In one embodiment, the modules are implemented as a computer program running on the at least one processing circuitry 610.

In still another alternative way to describe the embodiment in FIG. 6, the wireless device 600 may comprise a Central Processing Unit (CPU) which may be a single unit or a plurality of units. Furthermore, the wireless device 600 may comprise at least one computer program product (CPP) with a computer readable medium 641, e.g. in the form of a non-volatile memory, e.g. an EEPROM (Electrically Erasable Programmable Read-Only Memory), a flash memory or a disk drive. The CPP may comprise a computer program 640 stored on the computer readable medium 641, which comprises code means which when run on the CPU of the wireless device 600 causes the wireless device 600 to perform the methods described earlier in conjunction with FIG. 4. In other words, when said code means are run on the CPU, they correspond to the at least one processing circuitry 610 of the wireless device 600 in FIG. 6.

The invention has mainly been described above with reference to a few embodiments. However, as is readily appreciated by a person skilled in the art, other embodiments than the ones disclosed above are equally possible within the scope of the invention, as defined by the appended patent claims.

List of Further Example Embodiments

E1. A method performed by a network node of a wireless communication network, for transmitting system information to a wireless device in a synchronization signal, SS, block of an SS burst comprising at least one SS block, wherein the system information is multiplexed with information providing a time index indicating a boundary of the SS burst or of a set of SS bursts, the method comprising:
  generating (310) a scrambling sequence based on the information providing the time index,
  scrambling (320) the system information using the generated scrambling sequence,
  transmitting (330) to the wireless device, the scrambled system information multiplexed with the information providing the time index in the SS block.

E2. The method according to embodiment E1, wherein scrambling (320) the system information comprises at least one of the following:
  scrambling error-detection code bits related to the system information;
  scrambling coded bits of the system information;
  scrambling modulated symbols of the system information.

E3. The method according to any of the preceding embodiments, wherein the information providing the time index is transmitted without any error-detection code.

E4. The method according to any of the preceding embodiments, wherein the scrambling sequence is a pseudo-random sequence for which an initialization value is dependent on the time index.

E5. The method according to embodiment E4, wherein the initialization value is dependent on a further parameter provided by information carried by the SS block.

E6. A method performed by a wireless device, for receiving system information from a network node of a wireless communication system, the system information being received in a synchronization signal, SS, block of an SS burst comprising at least one SS block, wherein the system information is multiplexed with information providing a time index indicating a boundary of the SS burst or of a set of SS bursts, the method comprising:
  receiving (410) the information providing the time index,
  generating (420) a scrambling sequence based on the information providing the time index,
  receiving (430) the system information based on the boundary of the SS burst or of the set of SS bursts indicated by the time index, wherein the receiving comprises descrambling the received system information using the generated scrambling sequence,
  determining (440) an accuracy of the information providing the time index, based on an error-detection code related to the system information.

E7. The method according to embodiment E6, further comprising:
  when the information providing the time index is determined to be accurate, initiating an initial access procedure based on the received system information,
  when the information providing the time index is determined to be inaccurate, detecting another SS block for reception of the system information.

E8. The method according to any of embodiments E6-E7, wherein descrambling the received system information comprises at least one of the following:
  descrambling bits of the error-detection code related to the system information;
  descrambling coded bits of the system information;
  descrambling modulated symbols of the system information.

E9. The method according to any of embodiments E6-E8, wherein the information providing the time index is received without any error-detection code.

E10. The method according to any of embodiments E6-E9, wherein the scrambling sequence is a pseudo-random sequence for which an initialization value is dependent on the time index.

E11. The method according to embodiment E10, wherein the initialization value is dependent on a further parameter provided by information carried by the SS block.

E12. A network node (500) of a wireless communication network, configured to transmit system information to a wireless device in a synchronization signal, SS, block of an SS burst comprising at least one SS block, wherein the system information is multiplexed with information providing a time index indicating a boundary of the SS burst or of a set of SS bursts, the network node being further configured to:
  generate a scrambling sequence based on the information providing the time index,
  scramble the system information using the generated scrambling sequence,
  transmit to the wireless device, the scrambled system information multiplexed with the information providing the time index in the SS block.

E13. The network node according to embodiment E12, configured to scramble the system information in at least one of the following ways:

scramble error-detection code bits related to the system information;

scramble coded bits of the system information;

scramble modulated symbols of the system information.

E14. The network node according to any of embodiments E12-E13, wherein the information providing the time index is transmitted without any error-detection code.

E15. The network node according to any of embodiments E12-E14, wherein the scrambling sequence is a pseudo-random sequence for which an initialization value is dependent on the time index.

E16. The network node according to embodiment E15, wherein the initialization value is dependent on a further parameter provided by information carried by the SS block.

E17. A wireless device (600) configured to receive system information from a network node of a wireless communication system, the system information being received in a synchronization signal, SS, block of an SS burst comprising at least one SS block, wherein the system information is multiplexed with information providing a time index indicating a boundary of the SS burst or of a set of SS bursts, the wireless device being further configured to:

receive the information providing the time index, generate a scrambling sequence based on the information providing the time index, receive the system information based on the boundary of the SS burst or of the set of SS bursts indicated by the time index, wherein the receiving comprises descrambling the received system information using the generated scrambling sequence, determine an accuracy of the information providing the time index, based on an error-detection code related to the system information.

E18. The wireless device according to embodiment E17, further configured to:

when the information providing the time index is determined to be accurate, initiate an initial access procedure based on the received system information, when the information providing the time index is determined to be inaccurate, detect another SS block for reception of the system information.

E19. The wireless device according to any of embodiments E17-E18, further configured to descramble the received system information in at least one of the following ways:

descramble bits of the error-detection code related to the system information;

descramble coded bits of the system information;

descramble modulated symbols of the system information.

E20. The wireless device according to any of embodiments E17-E19, wherein the information providing the time index is received without any error-detection code.

E21. The wireless device according to any of embodiments E17-E20, wherein the scrambling sequence is a pseudo-random sequence for which an initialization value is dependent on the time index.

E22. The wireless device according to embodiment E21, wherein the initialization value is dependent on a further parameter provided by information carried by the SS block.

E23. A network node (500) of a wireless communication network, configured to transmit system information to a wireless device in a synchronization signal, SS, block of an SS burst comprising at least one SS block, wherein the system information is multiplexed with information providing a time index indicating a boundary of the SS burst or of a set of SS bursts, the network node comprising a processing circuitry (510) and a memory (530), the memory comprising instructions executable by the processing circuitry whereby the network node is configured to:

generate a scrambling sequence based on the information providing the time index, scramble the system information using the generated scrambling sequence, transmit to the wireless device, the scrambled system information multiplexed with the information providing the time index in the SS block.

E24. The network node of embodiment E23, wherein the memory contains instructions executable by the processing circuitry, whereby the network node is configured to perform the method of any of embodiments E2-E5.

E25. A wireless device (600) configured to receive system information from a network node of a wireless communication system, the system information being received in a synchronization signal, SS, block of an SS burst comprising at least one SS block, wherein the system information is multiplexed with information providing a time index indicating a boundary of the SS burst or of a set of SS bursts, the wireless device comprising a processing circuitry (610) and a memory (630), the memory containing instructions executable by the processing circuitry whereby the wireless device is configured to:

receive the information providing the time index, generate a scrambling sequence based on the information providing the time index, receive the system information based on the boundary of the SS burst or of the set of SS bursts indicated by the time index, wherein the receiving comprises descrambling the received system information using the generated scrambling sequence, determine an accuracy of the information providing the time index, based on an error-detection code related to the system information.

E26. The wireless device of embodiment E25, wherein the memory contains instructions executable by the processing circuitry, whereby the wireless device is configured to perform the method of any of embodiments E7-E11.

E27. A network node (500) of a wireless communication network, configured to transmit system information to a wireless device in a synchronization signal, SS, block of an SS burst comprising at least one SS block, wherein the system information is multiplexed with information providing a time index indicating a boundary of the SS burst or of a set of SS bursts, the network node comprising:

a generating module (511) adapted to generate a scrambling sequence based on the information providing the time index, a scrambling module (512) adapted to scramble the system information using the generated scrambling sequence, a transmit module (513) adapted to transmit to the wireless device, the scrambled system information multiplexed with the information providing the time index in the SS block.

E28. The network node of embodiment E27, further comprising modules adapted to perform the method of any of embodiments E2-E5.

E29. A wireless device (600) configured to receive system information from a network node of a wireless communication system, the system information being received in a synchronization signal, SS, block of an SS burst comprising at least one SS block, wherein the system information is multiplexed with information providing a time index indicating a boundary of the SS burst or of a set of SS bursts, the wireless device comprising:
- a first receiving module (611) adapted to receive the information providing the time index,
- a generating module (612) adapted to generate a scrambling sequence based on the information providing the time index,
- a second receiving module (613) adapted to receive the system information based on the boundary of the SS burst or of the set of SS bursts indicated by the time index, wherein the receiving comprises descrambling the received system information using the generated scrambling sequence,
- a determining module (614) adapted to determine an accuracy of the information providing the time index, based on an error-detection code related to the system information.

E30. The wireless device of embodiment E29, further comprising modules adapted to perform the method of any of embodiments E7-E11.

E31. A computer program comprising instructions which, when executed by at least one processor of a network node, causes the network node to carry out the method of any of embodiments E1-E5.

E32. A computer program comprising instructions which, when executed by at least one processor of a wireless device, causes the wireless device to carry out the method of any of embodiments E6-E11.

E33. A carrier containing the computer program of embodiment E31 or E32, wherein the carrier is one of an electronic signal, optical signal, radio signal, or computer readable storage medium.

What is claimed is:

1. A method performed by a wireless device, for receiving system information from a network node of a wireless communication system, the system information being received in a synchronization signal (SS) block of an SS burst set comprising at least one SS block, wherein the system information is multiplexed with information providing a time index indicating which SS block of the SS burst set is being received, the method comprising:
   - receiving the system information, wherein receiving comprises descrambling the system information using a scrambling sequence generated based on the time index; and
   - determining whether the information providing the time index is accurate, based on an error-detection code related to the received system information.

2. The method of claim 1, wherein the error detection code is a Cyclic Redundancy Check (CRC) attachment to information bits corresponding to the received system information, and wherein determining whether the information providing the time index is accurate comprises:
   - performing a CRC of the received system information based on the CRC attachment,
   - determining that the information providing the time index is inaccurate when the performed CRC indicates erroneously received system information, and
   - determining that the information providing the time index is accurate when the performed CRC indicates correctly received system information.

3. The method of claim 1, further comprising determining how to perform an initial access procedure based on determining whether the information providing the time index is accurate, wherein determining how to perform the initial access procedure comprises:
   - when the information providing the time index is determined to be accurate, completing the initial access procedure based on the received system information,
   - when the information providing the time index is determined to be inaccurate, detecting another SS block for reception of system information and time index before completing the initial access procedure.

4. The method of claim 1, wherein the information providing the time index is received without any related error-detection code.

5. The method of claim 1, wherein generating the scrambling sequence comprises initializing the scrambling sequence at the start of the SS block.

6. The method of claim 1, further comprising determining where the boundary of the SS burst set is or where the SS burst set starts using the information providing the time index.

7. A method performed by a network node of a wireless communication network, for transmitting system information to a wireless device in a synchronization signal (SS) block of an SS burst set comprising at least one SS block and a time index indicating which SS block of the SS burst set is being transmitted, the method comprising:
   - scrambling the system information using a scrambling sequence generated based on the time index, and
   - transmitting, to the wireless device, the scrambled system information multiplexed with information providing the time index and an error detection code related to the system information.

8. The method of claim 7, wherein scrambling the system information comprises scrambling coded bits of the system information.

9. The method of claim 7, wherein the error detection code is a Cyclic Redundancy Check (CRC) attachment to information bits corresponding to the system information.

10. The method of claim 7, wherein the information providing the time index is transmitted without any related error-detection code.

11. The method of claim 7, wherein the SS block has a certain size in the time dimension during which synchronization signals, the information providing the time index, and system information are transmitted.

12. The method of claim 7, wherein the error detection code related to the system information is transmitted to allow determination of whether the information providing the time index is accurate.

13. A wireless device configured to receive system information from a network node of a wireless communication system, the system information being in a synchronization signal (SS) block of an SS burst set comprising at least one SS block, wherein the system information is multiplexed with information providing a time index indicating which SS block of the SS burst set is being received, the wireless device comprising:
   - a processing circuitry; and
   - a memory, the memory containing instructions executable by the processing circuitry whereby the wireless device is configured to:
     - receive the system information by descrambling the system information using a scrambling sequence generated based on the time index, and
     - determine whether the information providing the time index is accurate, based on an error-detection code related to the received system information.

14. The wireless device of claim 13, wherein the error detection code is a Cyclic Redundancy Check (CRC) attachment to information bits corresponding to the received system information, and wherein the wireless device is further configured to determine whether the information providing the time index is accurate by:
  performing a CRC of the received system information based on the CRC attachment,
  determining that the information providing the time index is inaccurate when the performed CRC indicates erroneously received system information, and
  determining that the information providing the time index is accurate when the performed CRC indicates correctly received system information.

15. The wireless device of claim 13, wherein the wireless device is further configured to:
  determine how to perform an initial access procedure based on determining whether the information providing the time index is accurate.

16. The wireless device of claim 15, wherein the wireless device is configured to determine how to perform the initial access procedure by:
  when the information providing the time index is determined to be accurate, completing the initial access procedure based on the received system information,
  when the information providing the time index is determined to be inaccurate, detecting another SS block for reception of system information and time index before completing the initial access procedure.

17. The wireless device of claim 13, wherein the wireless device is further configured to:
  acquire synchronization with the network node based on the information in the SS block.

18. The wireless device of claim 13, wherein the wireless device is a User Equipment (UE).

19. A network node of a wireless communication network configured to transmit system information to a wireless device in a synchronization signal (SS) block of an SS burst set comprising at least one SS block and a time index indicating which SS block of the SS burst set is being transmitted, the network node comprising:
  a processing circuitry; and
  a memory, the memory comprising instructions executable by the processing circuitry whereby the network node is configured to:
    scramble the system information using a scrambling sequence generated based on the time index, and
    transmit, to the wireless device, the scrambled system information multiplexed with information providing the time index and an error detection code related to the system information.

20. The network node of claim 19, wherein the network node is configured to scramble the system information by scrambling coded bits of the system information.

21. The network node of claim 19, wherein the error detection code is a Cyclic Redundancy Check (CRC) attachment to information bits corresponding to the system information.

22. The network node of claim 19, wherein the network node is configured to transmit the error detection code related to the system information to allow determination of whether the information providing the time index is accurate.

23. A method performed by a network node of a wireless communication network, for transmitting system information to a wireless device in a synchronization signal (SS) block of an SS burst set comprising at least one SS block and a time index indicating which SS block of the SS burst set is being transmitted, the method comprising:
  scrambling the system information using a scrambling sequence generated based on the time index, wherein scrambling the system information comprises scrambling coded bits of the system information; and
  transmitting, to the wireless device, the scrambled system information multiplexed with information providing the time index and an error detection code related to the system information, wherein the error detection code is a Cyclic Redundancy Check (CRC) attachment to information bits corresponding to the system information, wherein the error detection code related to the system information is transmitted to allow determination of whether the information providing the time index is accurate, wherein the information providing the time index is transmitted without any related error-detection code;
wherein the SS block has a certain size in the time dimension during which synchronization signals, the information providing the time index, and system information are transmitted.

24. A network node of a wireless communication network configured to transmit system information to a wireless device in a synchronization signal (SS) block of an SS burst set comprising at least one SS block and a time index indicating which SS block of the SS burst set is being transmitted, the network node comprising:
  a processing circuitry; and
  a memory, the memory comprising instructions executable by the processing circuitry whereby the network node is configured to:
    scramble the system information using a scrambling sequence generated based on the time index, by scrambling coded bits of the system information, and
    transmit, to the wireless device, the scrambled system information multiplexed with information providing the time index and an error detection code related to the system information, wherein the network node is configured to transmit the error detection code related to the system information to allow determination of whether the information providing the time index is accurate and wherein the error detection code is a Cyclic Redundancy Check (CRC) attachment to information bits corresponding to the system information.

* * * * *

UNITED STATES PATENT AND TRADEMARK OFFICE
CERTIFICATE OF CORRECTION

PATENT NO. : 10,992,508 B2
APPLICATION NO. : 16/574560
DATED : April 27, 2021
INVENTOR(S) : Wang et al.

It is certified that error appears in the above-identified patent and that said Letters Patent is hereby corrected as shown below:

In the Specification

In Column 7, Line 1, delete "$c(n)=(x_1(n+N_c)+x_2(n+N_c))\bmod 2$" and insert -- $c(n)=(x_1(n+N_C)+x_2(n+N_C))\bmod 2$ --, therefor.

In Column 7, Line 6, delete "$N_c=1600.$" and insert -- $N_C=1600.$ --, therefor.

In Column 7, Line 8, delete "$c_{init}\sum_{i=0}^{30}x_2(i)\cdot 2^i$" and insert --  --, therefor.

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*